(12) United States Patent
Geelen et al.

(10) Patent No.: US 12,395,182 B1
(45) Date of Patent: Aug. 19, 2025

(54) ANALOG-TO-DIGITAL CONVERTER METHOD AND CIRCUITRY WITH REDUCED METASTABILITY ERROR

(71) Applicant: Marvell Asia Pte Ltd, Singapore (SG)

(72) Inventors: Govert Geelen, Eindhoven (NL); Edward Paulus, Venlo (NL)

(73) Assignee: Marvell Asia Pte Ltd, Singapore (SG)

( * ) Notice: Subject to any disclaimer, the term of this patent is extended or adjusted under 35 U.S.C. 154(b) by 136 days.

(21) Appl. No.: 18/341,141

(22) Filed: Jun. 26, 2023

Related U.S. Application Data

(60) Provisional application No. 63/355,705, filed on Jun. 27, 2022.

(51) Int. Cl.
| | |
|---|---|
| H03M 1/34 | (2006.01) |
| H03M 1/38 | (2006.01) |
| H03M 1/40 | (2006.01) |
| H03M 1/46 | (2006.01) |

(52) U.S. Cl.
CPC .............. *H03M 1/34* (2013.01); *H03M 1/38* (2013.01); *H03M 1/40* (2013.01); *H03M 1/462* (2013.01); *H03M 1/468* (2013.01)

(58) Field of Classification Search
CPC ............ H03M 1/34; H03M 1/38; H03M 1/40; H03M 1/462; H03M 1/468
USPC .................. 341/118, 120, 126, 163, 172
See application file for complete search history.

(56) References Cited

U.S. PATENT DOCUMENTS

| | | | |
|---|---|---|---|
| 8,988,268 B2 * | 3/2015 | Sugimoto | H03M 1/38 341/118 |
| 10,044,364 B1 * | 8/2018 | Sharif | H03M 1/468 |

* cited by examiner

*Primary Examiner* — Khai M Nguyen

(57) ABSTRACT

A method for converting an unknown analog voltage to a digital output signal includes receiving the unknown voltage, establishing a first stability threshold to distinguish between stable and metastable measurements of a voltage difference between the unknown voltage and a reference voltage, measuring that difference, determining whether the difference is greater or less than the first stability threshold, in response to determining that the difference is greater than the first stability threshold, yielding an output indicative of which one of the unknown and reference voltages is greater, in response to determining that the difference is less than the first stability threshold, overruling the output and assigning a predetermined output value indicative of which one of the unknown and reference voltages is greater, and deriving, from the output value indicative of which one of the unknown and reference voltages is greater, at least one bit of the digital output signal.

23 Claims, 8 Drawing Sheets

ANALOG-TO-DIGITAL CONVERTER METHOD AND CIRCUITRY WITH REDUCED METASTABILITY ERROR

CROSS REFERENCE TO RELATED APPLICATION

This disclosure claims the benefit of commonly-assigned U.S. Provisional Patent Application No. 63/355,705, filed Jun. 27, 2022, which is hereby incorporated by reference herein in its entirety.

FIELD OF USE

This disclosure relates to an analog-to-digital conversion method and circuitry that has reduced error under metastable conditions. More particularly, this disclosure relates to an analog-to-digital conversion method and circuitry including a comparator that makes arbitrary decisions during metastable conditions, while softening the arbitrary result in some implementations by using different thresholds of metastability for different purposes.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Many electronic circuits include analog-to-digital converter (ADC) circuitry. Certain types of ADCs, including a successive approximation register (SAR) ADC, may include comparator circuitry. The operation of ADC circuitry should be accurate, power-efficient, as well as fast relative to the data rate of the signals being converted. However, typical ADC circuitry may be unable to reliably execute an accurate analog-to-digital conversion when processing an analog signal that is close in magnitude to a reference signal used during the conversion process.

SUMMARY

In accordance with implementations of the subject matter of this disclosure, a method for converting an unknown analog voltage to a digital output signal includes receiving the unknown analog voltage, establishing a first voltage stability threshold to distinguish between a stable measurement and a metastable measurement of a voltage difference between the unknown analog voltage and a reference voltage, measuring the voltage difference between the unknown analog voltage and the reference voltage, determining whether the voltage difference is greater or less than the first voltage stability threshold, in response to determining that the voltage difference is greater than the first voltage stability threshold, driving output circuitry to yield an output indicative of which one of the unknown analog voltage and the reference voltage is greater, in response to determining that the voltage difference is less than the first stability threshold, overruling the output circuitry and assigning a predetermined output value indicative of which one of the unknown analog voltage and the reference voltage is greater, and deriving, from the output value indicative of which one of the unknown analog voltage and the reference voltage is greater, at least one bit of the digital output signal.

In a first implementation of such a method, the output indicative of which one of the unknown analog voltage and the reference voltage is greater may be a digital '1' when the unknown analog voltage is greater than the reference voltage, the output indicative of which one of the unknown analog voltage and the reference voltage is greater may be a digital '0' when the unknown analog voltage is less than the reference voltage, and the predetermined output indicative of which one of the unknown analog voltage and the reference voltage is greater may be a predetermined one of a digital '0' or '1'.

According to a first aspect of that first implementation, magnitude of the reference voltage may correspond to a precision of digital quantization used when deriving at least one bit of the digital output signal.

In a first instance of that first aspect, the reference voltage magnitude may further be indicative of a particular bit within a string of bits, and assigning the predetermined output value may further include assigning values to each bit that is less significant than the particular bit in the string of bits.

In a second instance of that first aspect, the reference voltage magnitude may further be indicative of a particular bit within a string of bits, and the first voltage stability threshold may be smaller than a voltage level corresponding to half of a voltage level of a least significant bit in the string of bits.

In a second implementation of such a method, establishing the first voltage stability threshold may include providing a transistor having a particular threshold voltage.

In a third implementation of such a method, determining that the voltage difference is less than the first stability threshold may include buffering both of the unknown analog voltage and the reference voltage to one of a digital logic level '0' or '1'.

A fourth implementation of such a method may further include establishing a second voltage stability threshold, larger than the first voltage stability threshold, determining whether the voltage difference is less than the second voltage stability threshold, and in response to determining that the voltage difference is less than the second voltage stability threshold, overruling the output circuitry and assigning the predetermined output value.

According to a first aspect of that fourth implementation, the reference voltage magnitude may be indicative of a particular bit within a string of bits, and assigning the predetermined output value may further include assigning values to each bit that is less significant that the particular bit in the string of bits.

According to a second aspect of that fourth implementation, the reference voltage magnitude may be indicative of a particular bit within a string of bits, and the second voltage stability threshold may be smaller than a voltage level corresponding to half of a voltage level of a least significant bit in the string of bits.

According to a third aspect of that fourth implementation, establishing the second voltage stability threshold may include providing first and second transistors having two particular threshold voltages, where the first transistor may establish the first voltage stability threshold and the second transistor may establish the second voltage stability threshold.

According to a fourth aspect of that fourth implementation, determining that the voltage difference is less than the second voltage stability threshold may include buffering both of the unknown analog voltage and the reference voltage to one of a digital logic level '0' or '1'.

In accordance with implementations of the subject matter of this disclosure, an analog-to-digital converter (ADC) includes input circuitry configured to receive an unknown analog voltage, level-setting circuitry configured to establish a reference voltage and establish a first voltage stability threshold to distinguish between a stable measurement and a metastable measurement of a voltage difference between the unknown analog voltage and the reference voltage, comparator circuitry configured to measure the voltage difference between the unknown analog voltage and the reference voltage, determine whether the voltage difference is greater or less than the first voltage stability threshold, in response to determining that the voltage difference is greater than the first voltage stability threshold, drive an output indicative of which one of the unknown analog voltage and the reference voltage is greater, and in response to determining that the voltage difference is less than the first voltage stability threshold, assign a predetermined output value indicative of which one of the unknown analog voltage and the reference voltage is greater, and output circuitry configured to drive, from the output value indicative of which one of the unknown analog voltage and the reference voltage is greater, at least one bit of the digital output signal.

In a first implementation of such an ADC the comparator circuitry may further be configured to drive the output indicative of which one of the unknown analog voltage and the reference voltage is greater to a digital '1' when the unknown analog voltage is greater than the reference voltage, drive the output indicative of which one of the unknown analog voltage and the reference voltage is greater to a digital '0' when the unknown analog voltage is less than the reference voltage, and assign, as the predetermined output indicative of which one of the unknown analog voltage and reference voltage is greater, a predetermined one of a digital '0' or '1'.

According to a first aspect of that first implementation, the level-setting circuitry may further be configured to provide the reference voltage as being indicative of a particular bit within a string of bits, and the comparator circuitry may further be configured to, upon assigning the predetermined output value, assign values to each bit that is less significant than the particular bit in the string of bits.

According to a second aspect of that first implementation, the level-setting circuitry may further be configured to establish the reference voltage to be indicative of a particular bit within a string of bits, and establish the first voltage stability threshold to be smaller than a voltage level corresponding to half of the voltage level of a least significant bit in the string of bits.

In a second implementation of such an ADC, a particular threshold voltage of a transistor of the level-setting circuitry may establish the first voltage stability threshold.

In a third implementation of such an ADC, the comparator circuitry may be configured to determine that the voltage difference is less than the first voltage stability threshold by buffering the first and second input signals to one of a digital logic level '0' or '1'.

In a fourth implementation of such an ADC, the level-setting circuitry may further be configured to establish a second voltage stability threshold, larger than the first voltage stability threshold, and the comparator circuitry may further be configured to determine whether the voltage difference is less than the second voltage stability threshold, and in response to determining that the voltage difference is less than the second voltage stability threshold, assign the predetermined output value.

According to a first aspect of that fourth implementation, the level-setting circuitry may further be configured to establish the reference voltage to be indicative of a particular bit within a string of bits, and the comparator circuitry may further be configured to, upon assigning the predetermined output value, assign values to each bit that is less significant than the particular bit in the string of bits.

In a first instance of that first aspect, the level-setting circuitry may further be configured to establish the reference voltage to be indicative of a particular bit within a string of bits, and establish the second voltage stability threshold level to be smaller than a voltage level corresponding to half of a voltage level of a least significant bit in the string of bits.

In a second instance of that first aspect, a first threshold voltage of a first transistor of the level-setting circuitry may establish the first voltage stability threshold and a second threshold voltage of a second transistor of the level-setting circuitry may establish the second voltage stability threshold.

In a first variation of that second instance, the comparator circuitry may be configured to determine that the voltage difference is less than the second stability threshold level by buffering the first and second input signals to one of a digital logic level '0' or '1'.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
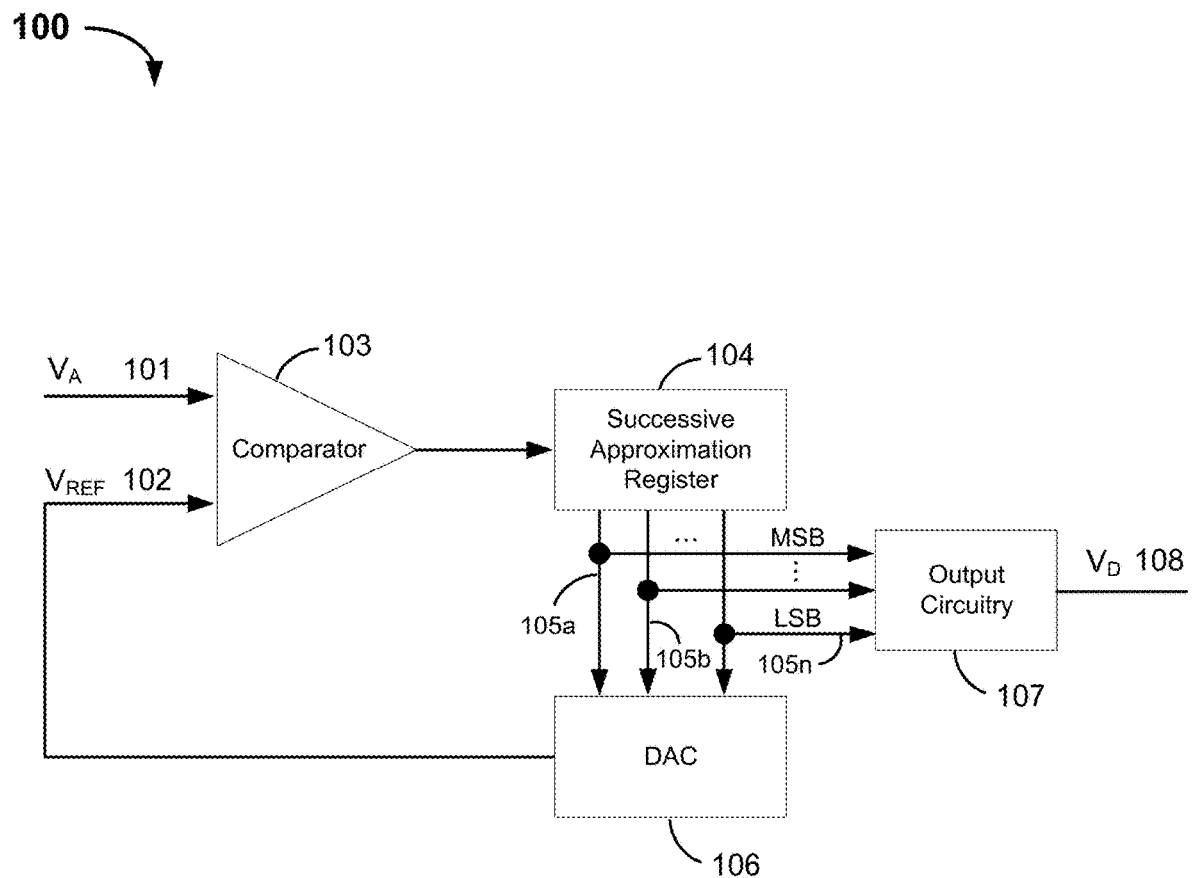
FIG. 1 is a block diagram of SAR ADC circuitry, in accordance with implementations of the subject matter of this disclosure, having reduced metastability error.
Figure 2:
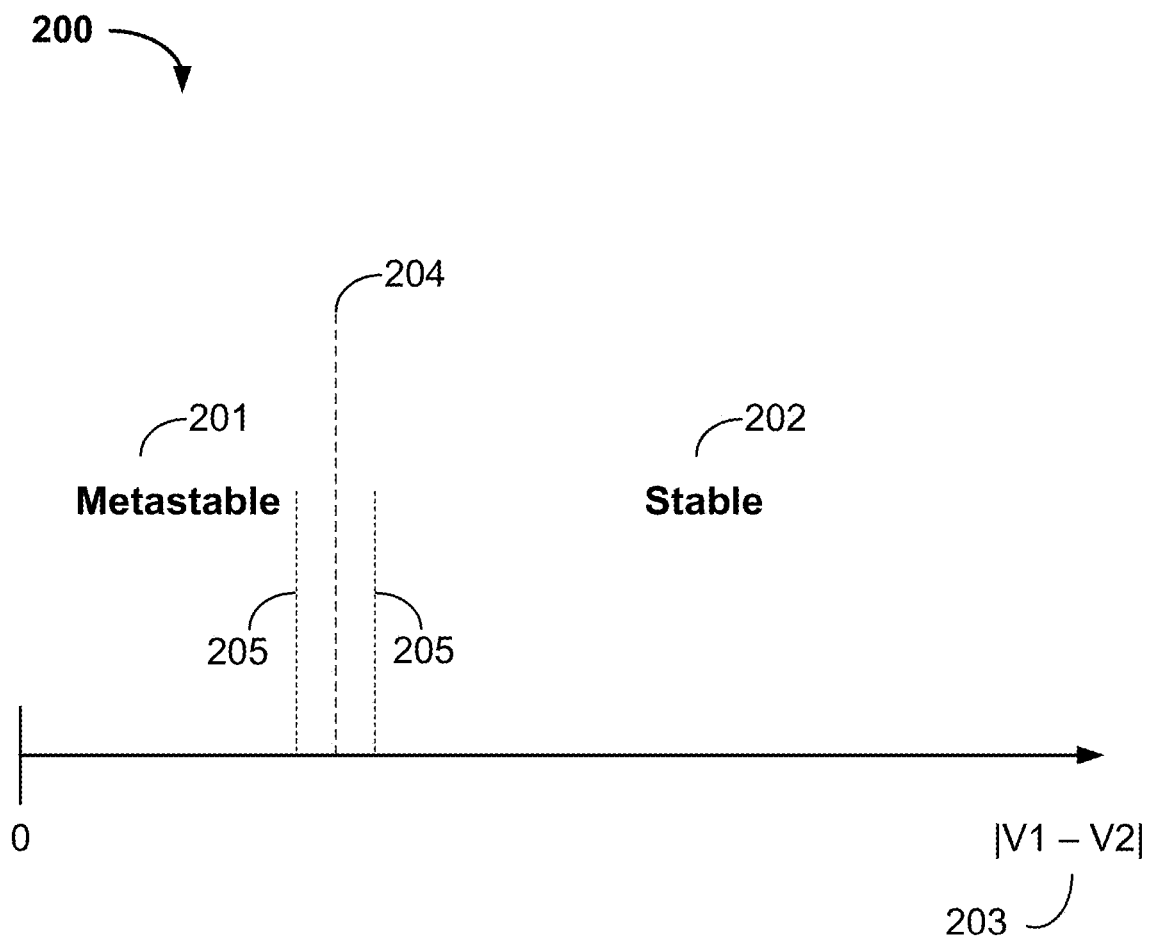
FIG. 2 is a graphical representation of the output of a comparator, in accordance with a first implementation of the subject matter of this disclosure, having metastable and stable regions based on the relative magnitudes of the input signals.

ADC circuitry is used for converting an analog input signal into a digitally-encoded data signal for further processing. Comparator circuitry may be included in the ADC circuitry to determine at least one bit of a digital signal corresponding to the analog signal by comparing the analog input signal to a reference signal to yield an output bit value indicative of which one of the analog and reference signals is greater. The signals being compared may also be (but are not necessarily) the two legs of a differential signal, where the bit value depends on which of the two legs is greater than the other. For example, a comparator may evaluate a voltage, current, or other characteristic of an unknown analog input signal with respect to a reference voltage, current, or other characteristic level and be configured to output a digital '1' if the analog signal level is greater than the reference signal level and output a digital '0' if the analog signal level is less than the reference signal level.

In certain ADC circuitry, a comparator may determine the value of each bit of a bit string that is assigned to digitally encode the value of an analog input signal. In this manner, an analog input signal may be encoded into a corresponding digital bit string with a configurable number of bits (i.e., a configurable precision). In some implementations—e.g., SAR ADC circuitry—, the comparator may be configured to successively repeat this operation for the same analog input signal (or analog signals derived from that initial analog input signal) using different reference signal levels, where each successive reference signal level depends on the prior determination (i.e., of a digital '0' or '1') and the number of total comparisons is equal to the length of a bit string digitally encoding the analog input signal level. For example, when the comparator within an ADC evaluates a bit, other than the first bit, corresponding to an output bit string, the analog signal used in such a comparison may be a derivative of an initial analog input signal, as derived by successive feedback-based modification (e.g., addition or subtraction) of that initial analog input signal by other components the ADC.

Because comparators are frequently used in analog-to-digital conversion, and many computational tasks require analog-to-digital conversion, many computational tasks require fast, power-efficient and accurate comparators.

In the event that the unknown analog input signal and a reference signal (e.g., where the reference signal is assigned by the ADC and compared to the analog signal by a comparator therein) are equal in magnitude or too close in magnitude (e.g., the absolute difference between the signals is less than a tolerance level of the comparator), the comparator may be unable to resolve the bit and the ADC may encode a digital signal that inaccurately represents the unknown analog input signal. In such instances, the comparator may toggle incessantly between both outputs, or may eventually output a digital '0' or '1' but only after an excessively long time. These conditions, or other occurrences where a comparator fails in response to receiving input signals that are too close together, may be referred to as comparator metastability. In response to comparator metastability, an ADC may stall, consume excess power, inaccurately convert the analog signal, or otherwise fail.

For example, a metastable comparator may resolve to the wrong digital output, which would cause an incorrect analog-to-digital conversion. Such an incorrect conversion may induce a particularly large error when it occurs on any of the first few bits of a bit string being generated by an ADC in which the comparator operates. In another example, a metastable comparator may take too long to resolve, possibly forcing circuitry coupled to the comparator to retry operations or initiate error-correcting procedures.

Therefore, in order to increase speed, reliability, and efficiency of ADCs, the probability of metastability conditions should be reduced, or the ability to remedially react to metastability conditions should be improved. These solutions should be power-efficient, should consume minimal integrated circuit device area, and should not introduce significant latency to the comparator operation.

In accordance with implementations of the subject matter of this disclosure, an ADC may include comparator circuitry that may identify metastability and, when metastability is detected, dictate a predetermined output. The predetermined output may correspond to a single comparison of the comparator, or it may correspond to multiple comparisons of the comparator (i.e., the predetermined output may include more than one bit of the digital bit string generated by the ADC).

The subject matter of this disclosure may be better understood by reference to FIGS. 1-8.

Block diagram 100 corresponds to SAR ADC circuitry with reduced metastability error. The SAR ADC couples an unknown analog voltage $V_A$ 101 and a reference voltage $V_{REF}$ 102 to the inputs of comparator 103. While voltages are shown as the signals in block diagram 100, the subject matter of this disclosure may similarly be applied to current signals or other characteristic signals of an arbitrary and unknown analog input that may be converted to a corresponding digital output using ADC circuitry including comparator 103.

Comparator 103 delivers an output to SAR 104 indicative of which one of analog voltage $V_A$ 101 or reference voltage $V_{REF}$ 102 is greater. This output may be incorrect in cases where analog voltage $V_A$ 101 and reference voltage $V_{REF}$ 102 are equal or too close in magnitude, unless comparator 103 is configured to operate remedially under such conditions, as explained below. SAR 104 reports bit values 105*a* (i.e., a most significant bit) to 105*n* (i.e., a least significant bit) to DAC 106 and output circuitry 107, where the number of bit values 105 corresponds to the length (i.e., precision) of the digital bit string encoding the analog voltage $V_A$ 101. During successive operations of ADC 100, e.g., to successively assign bit values in order of decreasing significance, DAC 106 assigns successive values to $V_{REF}$ 102. Such successive values of $V_{REF}$ 102 may be determined according to whether the prior comparator 103 output was a digital '0' or '1'. After the bit string digitally encoding analog voltage $V_A$ 101 has been fully defined, output circuitry 107 generates digital voltage $V_D$ 108, whereby the ADC operation has converted $V_A$ 101 to $V_D$ 108. Though not explicitly shown, in some implementations, ADC 100 may additionally include feedback circuitry that may modify analog voltage $V_A$ 101 (e.g., by addition or subtraction) between successive comparator 103 operations, and each such modification may further depend on the prior output of comparator 103 (i.e., a digital '0' or '1').

Graphical representation 200 corresponds to a comparator (e.g., comparator 103 of FIG. 1) with a metastable response region 201 and a stable response region 202. The response regions are based on the separation magnitude 203 between two input signals—i.e., the absolute value of (V1−V2). When the separation magnitude 203 is less than stability threshold 204, the comparator is metastable. When the separation magnitude 203 is greater than stability threshold 204, the comparator is stable. There also exists a proximity range 205 centered around stability threshold 204, where it may be uncertain whether the comparator is in a metastable condition, as discussed in greater detail below.

When the comparator is in the stable response region 202, it yields a digital '0' or '1' according to which one of the two input signals is greater. When the comparator is in the metastable response region 201, the metastability condition is detected. In a single-bit implementation, the metastability condition corresponds to a case where either of a digital '0' or a digital '1' is an equally correct encoding of the bit (i.e., the discretization error upon analog-to-digital conversion is equivalent, within a tolerance limit of the ADC, for either encoded value). Therefore, deterministic output circuitry is activated to overrule the regular output circuitry that operates under stable conditions. The deterministic output circuitry instead assigns a predetermined output which is a predetermined one of a digital '0' or a digital '1'.

Implementations of the subject matter of this disclosure can be used in the decoding of a multibit string (e.g., when the comparator is implemented within a SAR ADC). For example, in an initial comparison of a SAR ADC, the most significant bit may be determined by comparing the first input (e.g., V1, which may be of unknown magnitude) and the second input (e.g., V2, which may be a known reference voltage level). In such an initial comparison operation, identifying the metastable response region 201 further identifies the magnitude of V1 as being nearly equal to that of V2. Therefore, the predetermined output not only encodes a value for the most significant bit, but also may further encode the entire multibit string by assigning a sequence of bits corresponding to a voltage magnitude that equal to or one least significant bit less (or greater) than the known reference voltage. In this approach, successive repetitions of the comparator are avoided based on the determination that the two input signals are nearly equal in magnitude. In other words, in response to identifying the metastable response region 201, the analog input signal (of formerly unknown magnitude) becomes fully defined and may be digitally encoded without requiring additional comparisons.

When implemented in a multi-bit ADC, stability threshold 204 could be configured so that the entire metastable 201 response region corresponds to less than one half of a least significant bit of the ADC. As such, the metastability determination applies to a voltage range that does not overlap with any reference voltage level (e.g., V2) that may be applied during operation of the comparator.

Figure 3:
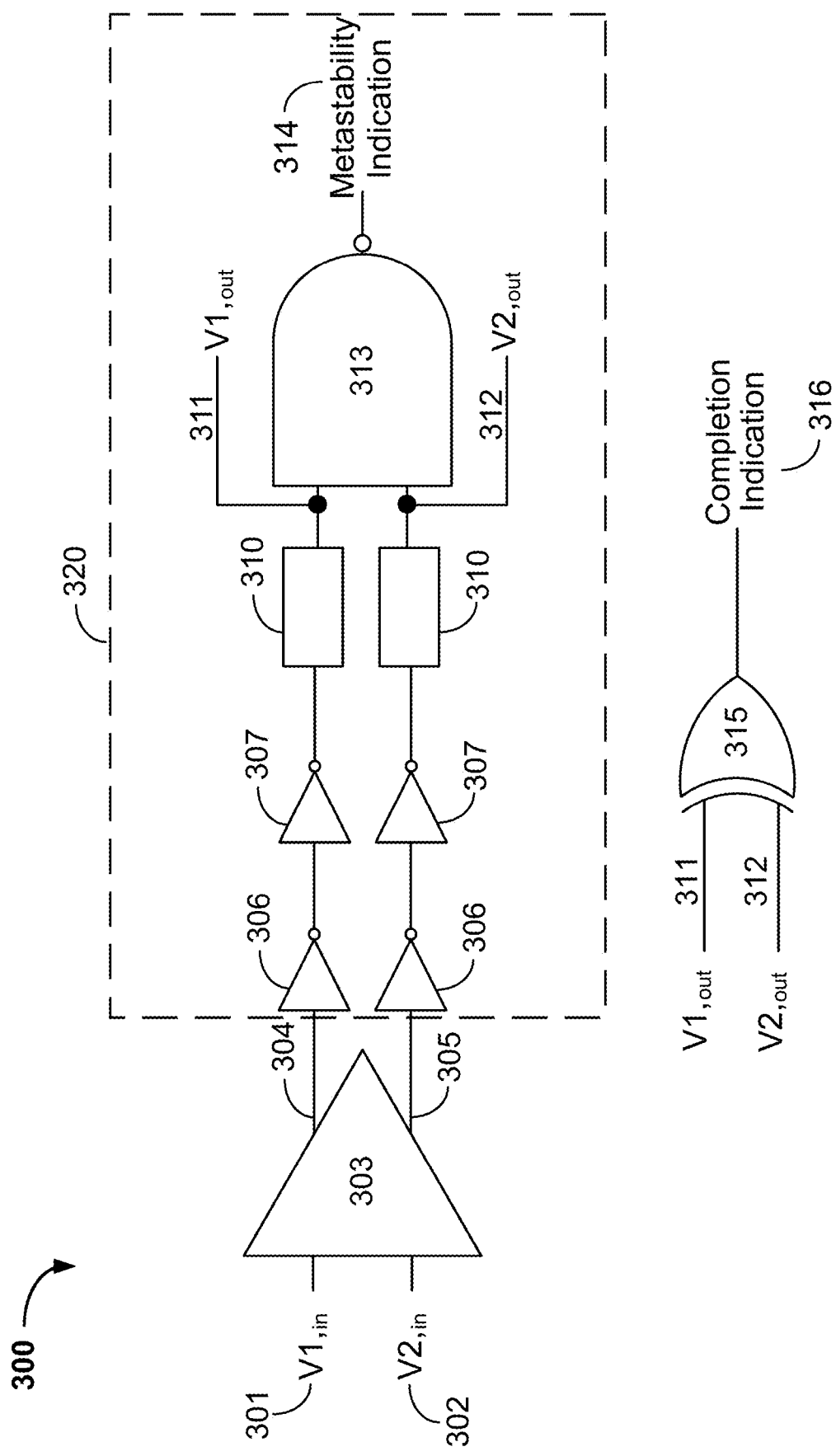
FIG. 3 is a block diagram of comparator circuitry with metastability compensation, according to that first implementation of the subject matter of this disclosure.

The comparator response regions depicted in graphical representation 200 may be determined using the comparator circuit block 300 with metastability compensation, as shown in FIG. 3. Input signals $V1_{,in}$ 301 and $V2_{,in}$ 302 are compared by comparator 303, which generates preliminary output signals 304 and 305, which respectively correspond to $V1_{,in}$ 301 and $V2_{,in}$ 302. Each of preliminary output signals 304 and 305 is buffered through inverters 306 and 307.

Inverters 306 and 307 are configured so that when $V1_{,in}$ 301 and $V2_{,in}$ 302 are of equal or nearly equal magnitude (i.e., their separation magnitude 203 corresponds to metastable region 201), each of preliminary output signals 304 and 305 is temporarily buffered to a digital '0' and cells 310 are activated to drive each of $V1_{,out}$ 311 and $V2_{,out}$ 312 to a digital '1'. The stability threshold 204 is configurable by providing at least one particular threshold voltage of at least one transistor of inverters 306 and 307, which serve as level-setting circuitry for stability threshold level 204. For example, if instantiating inverter 306 using one PMOS device and one NMOS device, then the PMOS device and the NMOS device may be intentionally mismatched so that a skewed threshold voltage of either device may skew the input-output response of the inverter (e.g., the input-output response may not be symmetric around the voltage level halfway between digital '0' and '1'). Correspondingly, preliminary output signals 304 and 305 are buffered so that cells 310 both output a digital '1' in response to a metastability condition. Although this particular inverter configuration is representative of one implementation, other inverter configurations may be applied to achieve similar results. Inverters 306 and 307 may be identical. Alternatively, only one of inverters 306 or 307 may include skewed devices, or the skews of the devices within each inverter may be unique.

Cells 310 output feedback signals $V1_{,out}$ 311 and $V2_{,out}$ 312. These signals may be simultaneously coupled to the input (e.g., for adding or subtracting to $V1_{,in}$ 301 and $V2_{,in}$ 302 to allow a subsequent comparison in a SAR implementation) and coupled to NAND gate 313. In response to both of $V1_{,out}$ 311 and $V2_{,out}$ 312 being a digital '1', NAND gate 313 outputs a digital '0' as metastability indication 314, which is indicative of metastable response region 201. In response, output circuitry corresponding to stable response region 202 is overruled, and a predetermined output is dictated to indicate which one of $V1_{,in}$ 301 or $V2_{,in}$ 302 is greater.

When input signals $V1_{,in}$ 301 and $V2_{,in}$ 302 are not of equal or nearly equal magnitude (i.e., separation magnitude 203 corresponds to stable region 202), $V1_{,out}$ 311 and $V2_{,out}$ 312 are unaffected by inverters 306 and 307. Due to stable processing by comparator 303, one of $V1_{,out}$ 311 or $V2_{,out}$ 312 is a digital '1' and the other is a digital '0'. Therefore, XOR gate 315 outputs a digital '1' as completion indication 316, which is indicative of stable response region 203.

In some implementations, comparator 103 is implemented using comparator circuit blocks 300. With regard to the block diagram of FIG. 3, although a specific buffering scheme and logical gates are shown, other buffering schemes or logical gates (e.g., an AND gate, an OR gate, a NOR gate, additional NAND gates, other suitable logic gates, or any combination thereof) may be applied to achieve similar functionality.

Figure 4:
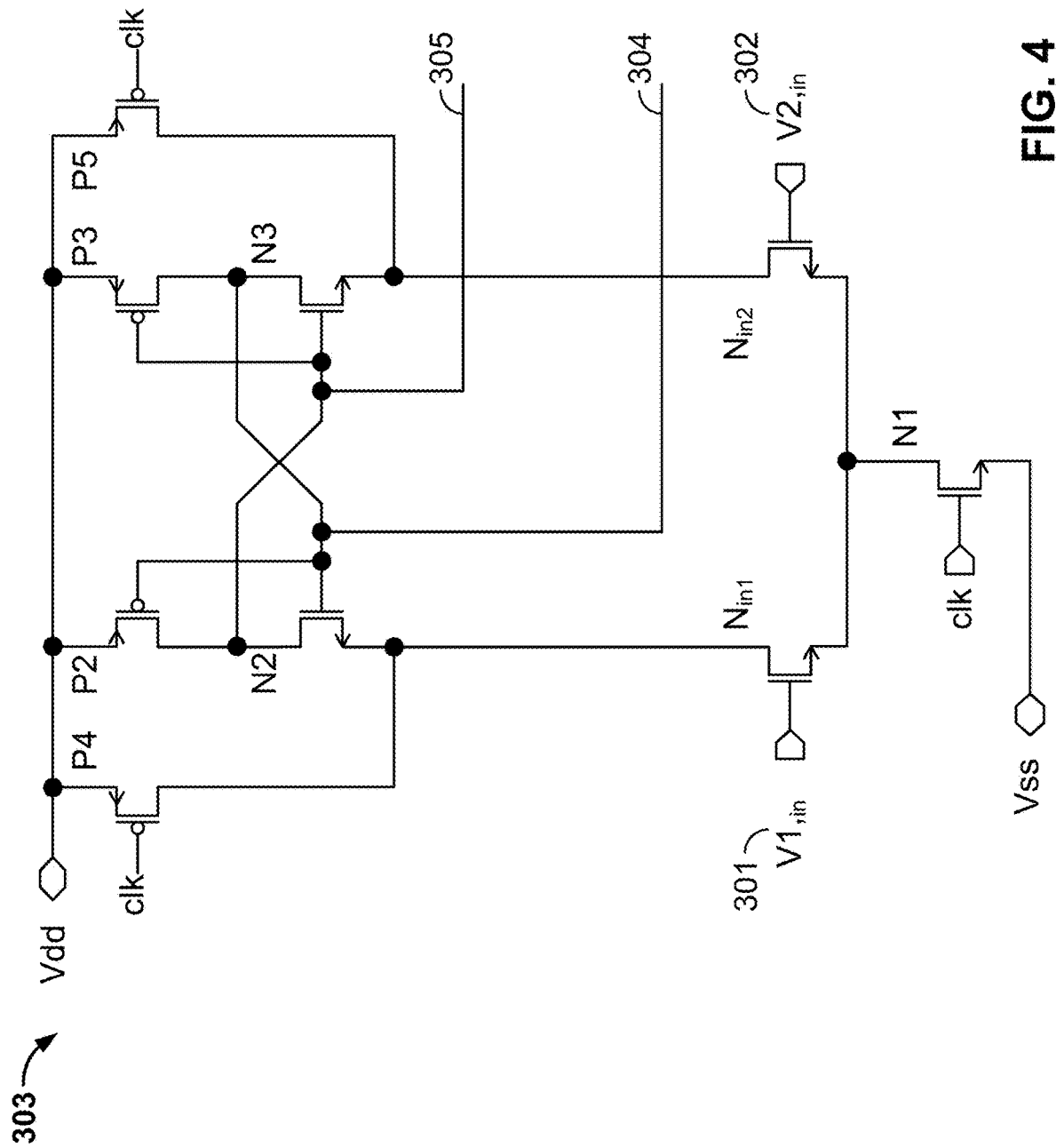
FIG. 4 is a schematic circuit diagram of comparator circuitry, in accordance with that first implementation of the subject matter of this disclosure.

FIG. 4 is a schematic representation of comparator 303 (e.g., a comparator without additional circuitry for metastability compensation). When the clock ('clk') signal is a digital '1', internal comparator signals 304 and 305, which respectively correspond to input signals $V1_{,in}$ 301 and $V2_{,in}$ 302, are driven so that the signal corresponding to the greater of $V1_{,in}$ 301 and $V2_{,in}$ 302 is driven to a digital '1,' while the other of signals $V1_{,in}$ 301 and $V2_{,in}$ 302 is driven to a digital '0'. As mentioned, when input signals $V1_{,in}$ 301 and $V2_{,in}$ 302 are close in magnitude, both internal comparator signals 304 and 305 are temporarily driven to the digital '0' value. In response, the circuitry coupled to internal comparator signals 304 and 305 (e.g., subblock 320 in FIG. 3) may determine that the circuit is in metastable response region 201 and accordingly dictate a predetermined value, as described above.

Figure 5:
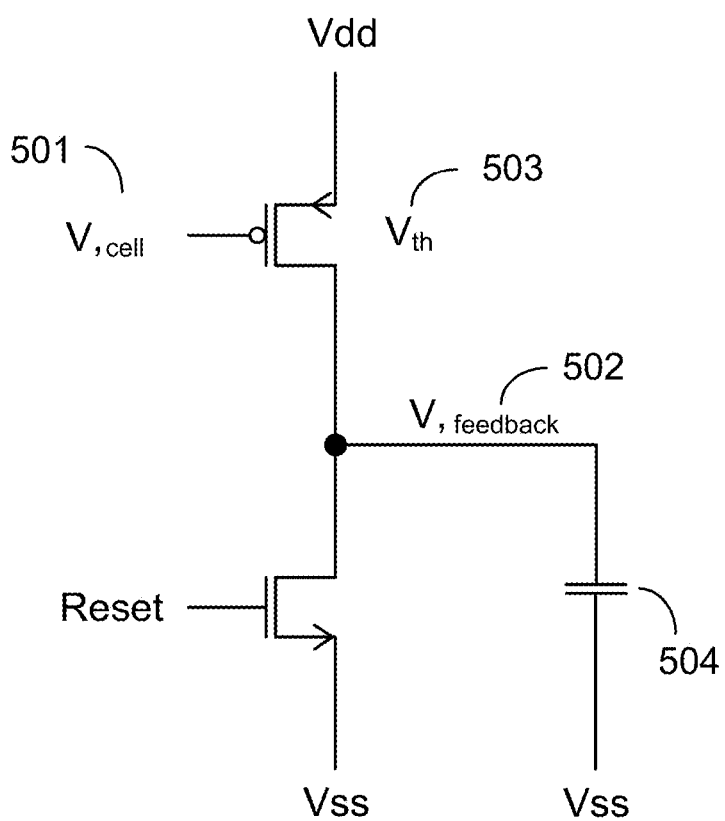
FIG. 5 is a schematic representation of a circuit structure for detecting metastability, in accordance with implementations of the subject matter of this disclosure.
Figure 6:
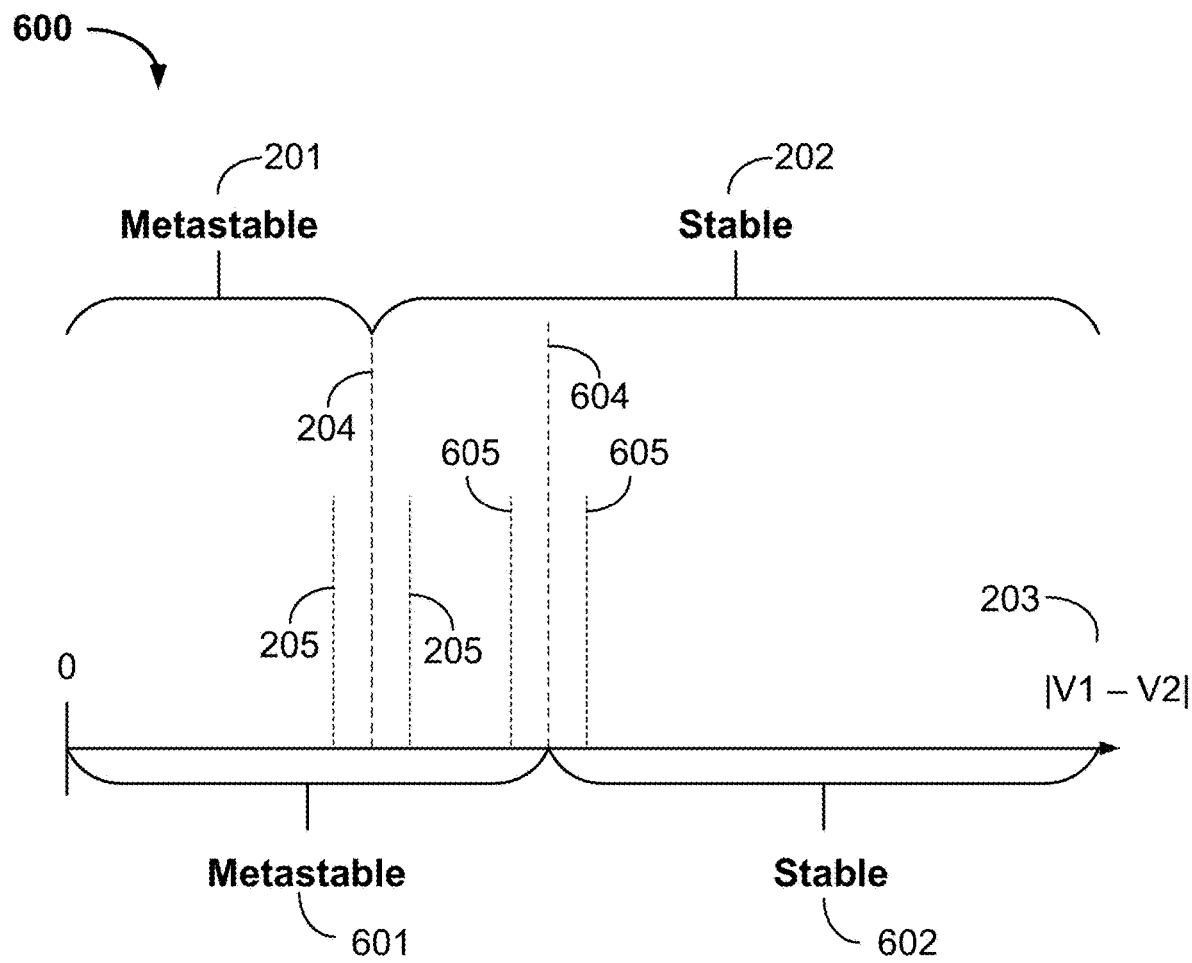
FIG. 6 is a graphical representation of the output of a comparator with two sets of metastable and stable regions based on the relative magnitudes of one set of input signals, in accordance with a second implementation of the subject matter of this disclosure.

FIG. 5 is a schematic representation of cell 310. When $V_{,cell}$ 501 is a digital '0', the cell 310 drives $V_{,feedback}$ 502 to a digital '1'. A metastability condition is declared when both differential instantiations of cell 310 drive both differential $V_{,feedback}$ 502 signals to a digital '1'. In contrast, when $V_{,cell}$ 501 is a digital '1', the cell drives $V_{,feedback}$ 502 to a digital '0' and the metastability condition may not be declared. In such a case, $V_{,feedback}$ 502 stays at a digital '0' after having been driven there by the reset signal being a digital '1' (e.g., when the 'clk' signal is a digital '0'). The stability threshold 204 is further configurable by providing cell 310 with a particular threshold voltage 503 (Vth), which may serve as additional level-setting circuitry for stability threshold level 204. The capacitor 504 of cell 310 holds the $V_{feedback}$ 502 signal so that it may be coupled to metastability indicator 313.

Notwithstanding the foregoing description of the operation of comparator circuitry block 300, within the proximity limit 205 of stability threshold 204, comparator circuitry block 300 may be unable to determine whether the separation magnitude 203 corresponds to metastable region 201 or stable region 202. For example, separation magnitude 203 may be insufficiently small to drive metastability indication 314 to a digital '0' (i.e., metastability is not determined) while also being insufficiently large to drive completion indication 316 to a digital '1' (i.e., completion is not determined).

Accordingly, in further implementations of the subject matter of this disclosure, a comparator 600 may be provided which makes two distinct determinations of whether the separation magnitude 203 corresponds to a metastable region or a stable region. A first stability threshold level 204 corresponds to metastable region 201 and stable region 202, and a second stability threshold level 604 corresponds to second metastable region 601 and second stable region 602. Second stability threshold level 604 is larger than first stability threshold level 204, and the two stability threshold levels 204 and 604 are set far enough apart that the range of proximity limit 605 does not overlap with the range of proximity limit 205. Still, the entire metastable 601 response region corresponds to less than one half of a least significant bit of the ADC. As such, the metastability determination applies to a voltage range that does not overlap with any reference voltage level that may be applied during operation of the comparator.

Figure 7:
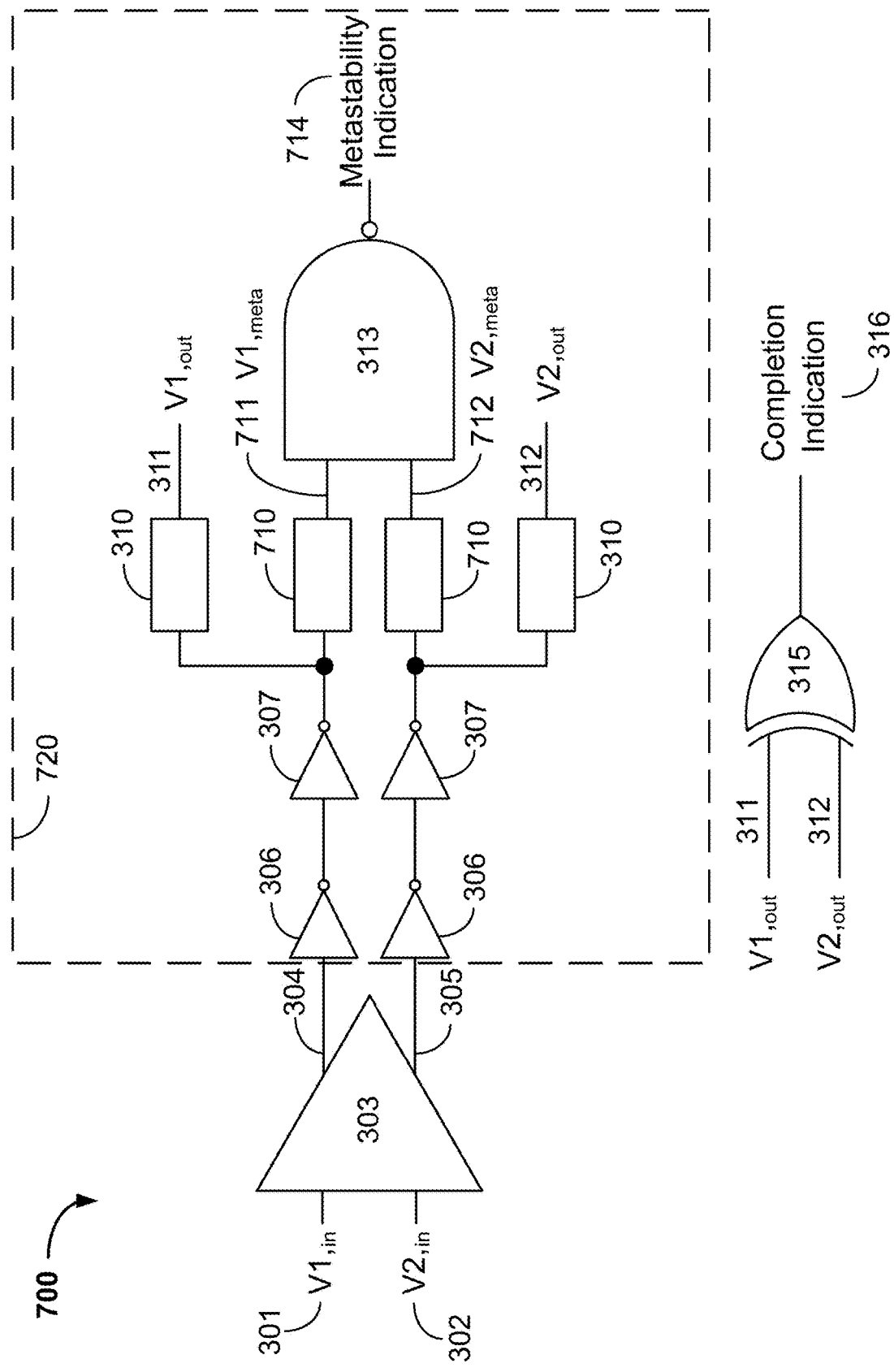
FIG. 7 is a block diagram of comparator circuitry with metastability compensation according to that second implementation of the subject matter of this disclosure.

The comparator response regions depicted in graphical representation 600 may be provided using the comparator circuit block 700 of FIG. 7. Compared to the circuit block 300 of FIG. 3, FIG. 7 includes a new metastability indication 714 and additionally includes a second set of cells 710. These cells 710 are coupled to the new metastability indication 714 and are skewed with respect to cells 310. Therefore, cells 710 may serve as level-setting circuitry for setting stability threshold level 604 (relative to the stability threshold level 204 as determined by inverters 306 and 307). In response to processing by inverters 306 and 307 and cells 710, signals $V1_{,meta}$ 711 and $V2_{,meta}$ 712 are driven to logical '1' when separation magnitude 203 corresponds to metastable region 601, and particularly when separation magnitude 203 corresponds to the range of signal levels between proximity limits 205. Thus, the circuitry coupled to internal comparator signals 304 and 305 (e.g., subblock 720 in FIG. 7) may establish the comparator response regions as depicted in graphical representation 600. For example, cells 710 may be similar to cells 310, but with a unique threshold voltage 503, so that the single comparator circuit block 700 establishes both stability threshold levels 204 and 604. In cases where separation magnitude 203 corresponds to stable region 202, particularly the range of signal levels between proximity limits 605, the comparator circuit blocks 700 yield a stable output corresponding to the operation of comparator circuit blocks 300.

Circuit blocks 700 may operate without metastability-induced error across the entire possible range of separation magnitude 203. When separation magnitude 203 is above proximity limit 605, circuit block 700 identifies stable response region 202 based on completion indication 316 and accordingly yields a stable output. When separation magnitude 203 is lesser than the lower edge of proximity limit 605, circuit block 700 identifies metastable response region 601 based on metastability indication 714 and accordingly dictates a predetermined output.

In some implementations, comparator 103 is implemented using comparator circuit blocks 700. With regard to the block diagram of FIG. 7, although a specific buffering scheme and logical gates are shown, other buffering schemes or logical gates (e.g., an AND gate, an OR gate, a NOR gate, additional NAND gates, other suitable logic gates, or any combination thereof) may be applied to achieve similar functionality.

Figure 8:
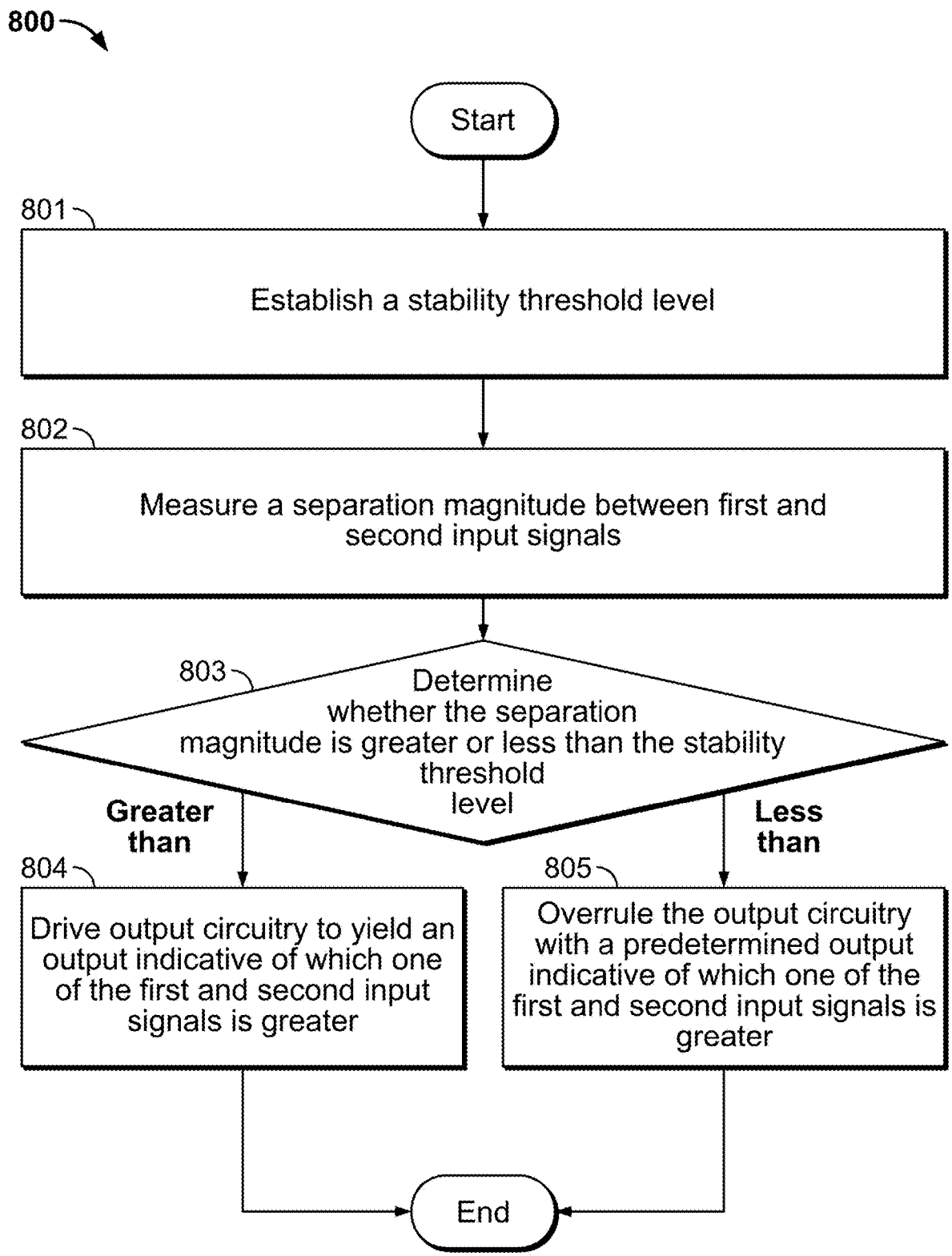
FIG. 8 is a flow diagram of a method in accordance with implementations of the subject matter of this disclosure.

A method 800 in accordance with implementations of the subject matter of this disclosure, for operating architecture 300, is shown in FIG. 8. Method 800 starts at 801 where a stability threshold level (e.g., FIG. 2) is established by a threshold voltage of at least one transistor (e.g., within a circuit block of FIG. 3). At 802, a difference (e.g., a voltage, current, other energy difference, or other characteristic level) is measured between first and second input signals (e.g., by the comparator of FIG. 4). The stability threshold establishes stable and metastable response regions based on that difference between the first and second signals. At 803, it is determined whether the difference level is greater or less than the stability threshold level (e.g., by the cell of FIG. 5). If it is determined that the difference level is greater than the stability threshold level, then at 804 output circuitry is driven to yield an output indicative of which one of the first and second input signals is greater. However, if it is determined that the difference level is less than the stability threshold level, then at 805 output circuitry is overruled with a predetermined output indicative of which one of the first and second input signals is greater and method 800 ends.

The analog-to-digital conversion method and circuitry disclose herein, that has reduced error under metastable conditions, may be used as the ethernet physical layer (i.e., PHY) for very fast, reliable, and power-efficient ADCs in 10 gigabit ethernet applications (i.e., 10GBaseT). The methods and apparatus disclosed herein satisfy bit-error-rate requirements in view of circuitry that may be used to receive an analog input signal, process a digital output signal, perform other computational tasks, or any combination thereof.

Thus it is seen that analog-to-digital conversion methods and circuitry that have reduced error under metastable conditions, for executing fast, power-efficient, and reliable conversions, have been provided.

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for converting an unknown analog voltage to a digital output signal, the method comprising:
receiving the unknown analog voltage;
establishing a first voltage stability threshold to distinguish between a stable measurement and a metastable measurement of a voltage difference between the unknown analog voltage and a reference voltage;
measuring the voltage difference between the unknown analog voltage and the reference voltage;
determining whether the voltage difference is greater or less than the first voltage stability threshold;
in response to determining that the voltage difference is greater than the first voltage stability threshold, driving output circuitry to yield an output indicative of which one of the unknown analog voltage and the reference voltage is greater;
in response to determining that the voltage difference is less than the first stability threshold, overruling the output circuitry and assigning a predetermined output value indicative of which one of the unknown analog voltage and the reference voltage is greater; and
deriving, from the output value indicative of which one of the unknown analog voltage and the reference voltage is greater, at least one bit of the digital output signal.

2. The method for converting an unknown analog voltage to a digital output signal according to claim 1, wherein:
the output indicative of which one of the unknown analog voltage and the reference voltage is greater is a digital '1' when the unknown analog voltage is greater than the reference voltage;
the output indicative of which one of the unknown analog voltage and the reference voltage is greater is a digital '0' when the unknown analog voltage is less than the reference voltage; and
the predetermined output value indicative of which one of the unknown analog voltage and the reference voltage is greater is a predetermined one of a digital '0' or '1'.

3. The method for converting an unknown analog voltage to a digital output signal according to claim 2, wherein magnitude of the reference voltage corresponds to a precision of digital quantization used when deriving at least one bit of the digital output signal.

4. The method for converting an unknown analog voltage to a digital output signal according to claim 3, wherein:
the reference voltage magnitude is further indicative of a particular bit within a string of bits; and
assigning the predetermined output value further comprises assigning values to each bit that is less significant than the particular bit in the string of bits.

5. The method for converting an unknown analog voltage to a digital output signal according to claim 3, wherein:
the reference voltage magnitude is further indicative of a particular bit within a string of bits; and
the first voltage stability threshold is smaller than a voltage level corresponding to half of a voltage level of a least significant bit in the string of bits.

6. The method for converting an unknown analog voltage to a digital output signal according to claim 1, wherein establishing the first voltage stability threshold comprises providing a transistor having a particular threshold voltage.

7. The method for converting an unknown analog voltage to a digital output signal according to claim 1, wherein determining that the voltage difference is less than the first stability threshold comprises buffering both of the unknown analog voltage and the reference voltage to one of a digital logic level '0' or '1'.

8. The method for converting an unknown analog voltage to a digital output signal according to claim 1, further comprising:
establishing a second voltage stability threshold, larger than the first voltage stability threshold;
determining whether the voltage difference is less than the second voltage stability threshold; and
in response to determining that the voltage difference is less than the second voltage stability threshold, overruling the output circuitry and assigning the predetermined output value.

9. The method for converting an unknown analog voltage to a digital output signal according to claim 8, wherein:

magnitude of the reference voltage is indicative of a particular bit within a string of bits; and
assigning the predetermined output value further comprises assigning values to each bit that is less significant that the particular bit in the string of bits.

10. The method for converting an unknown analog voltage to a digital output signal according to claim 8, wherein:
the reference voltage magnitude is indicative of a particular bit within a string of bits; and
the second voltage stability threshold is smaller than a voltage level corresponding to half of a voltage level of a least significant bit in the string of bits.

11. The method for converting an unknown analog voltage to a digital output signal according to claim 8, wherein establishing the second voltage stability threshold comprises providing first and second transistors having two particular threshold voltages, wherein the first transistor establishes the first voltage stability threshold and the second transistor establishes the second voltage stability threshold.

12. The method for converting an unknown analog voltage to a digital signal according to claim 8, wherein determining that the voltage difference is less than the second voltage stability threshold comprises buffering both of the unknown analog voltage and the reference voltage to one of a digital logic level '0' or '1'.

13. An analog-to-digital converter (ADC) comprising:
input circuitry configured to receive an unknown analog voltage;
level-setting circuitry configured to:
establish a reference voltage;
establish a first voltage stability threshold to distinguish between a stable measurement and a metastable measurement of a voltage difference between the unknown analog voltage and the reference voltage, and
comparator circuitry configured to:
measure the voltage difference between the unknown analog voltage and the reference voltage, determine whether the voltage difference is greater or less than the first voltage stability threshold,
in response to determining that the voltage difference is greater than the first voltage stability threshold, drive an output indicative of which one of the unknown analog voltage and the reference voltage is greater, and
in response to determining that the voltage difference is less than the first voltage stability threshold, assign a predetermined output value indicative of which one of the unknown analog voltage and the reference voltage is greater; and
output circuitry configured to derive, from the output value indicative of which one of the unknown analog voltage and the reference voltage is greater, at least one bit of the digital output signal.

14. The ADC of claim 13, wherein the comparator circuitry is further configured to:
drive the output indicative of which one of the unknown analog voltage and the reference voltage is greater to a digital '1' when the unknown analog voltage is greater than the reference voltage;
drive the output indicative of which one of the unknown analog voltage and the reference voltage is greater to a digital '0' when the unknown analog voltage is less than the reference voltage; and assign, as the predetermined output value indicative of which one of the unknown analog voltage and the reference voltage is greater, a predetermined one of a digital '0' or '1'.

15. The ADC of claim 14, wherein:
the level-setting circuitry is further configured to provide the reference voltage as being indicative of a particular bit within a string of bits; and
the comparator circuitry is further configured to, upon assigning the predetermined output value, assign values to each bit that is less significant than the particular bit in the string of bits.

16. The ADC of claim 14, wherein the level-setting circuitry is further configured to:
establish the reference voltage to be indicative of a particular bit within a string of bits, and
establish the first voltage stability threshold to be smaller than a voltage level corresponding to half of a voltage level of a least significant bit in the string of bits.

17. The ADC of claim 13, wherein a particular threshold voltage of a transistor of the level-setting circuitry establishes the first voltage stability threshold.

18. The ADC of claim 13, wherein the comparator circuitry is configured to determine that the voltage difference is less than the first voltage stability threshold by buffering the unknown analog voltage and the reference voltage to one of a digital logic level '0' or '1'.

19. The ADC of claim 13, wherein:
the level-setting circuitry is further configured to establish a second voltage stability threshold, larger than the first voltage stability threshold; and
the comparator circuitry is further configured to:
determine whether the voltage difference is less than the second voltage stability threshold, and
in response to determining that the voltage difference is less than the second voltage stability threshold, assign the predetermined output value.

20. The ADC of claim 19, wherein a first threshold voltage of a first transistor of the level-setting circuitry establishes the first voltage stability threshold and a second threshold voltage of a second transistor of the level-setting circuitry establishes the second voltage stability threshold.

21. The ADC of claim 20, wherein the comparator circuitry is configured to determine that the voltage difference is less than the second stability threshold level by buffering the first and second input signals to one of a digital logic level '0' or '1'.

22. The ADC of claim 19, wherein:
the level-setting circuitry is further configured to establish the reference voltage to be indicative of a particular bit within a string of bits; and
the comparator circuitry is further configured to, upon assigning the predetermined output value, assign values to each bit that is less significant than the particular bit in the string of bits.

23. The ADC of claim 19, wherein the level-setting circuitry is further configured to:
establish the reference voltage to be indicative of a particular bit within a string of bits, and
establish the second voltage stability threshold level to be smaller than a voltage level corresponding to half of the voltage level of a least significant bit in the string of bits.

* * * * *